United States Patent [19]
Rosenfeld et al.

[11] Patent Number: 6,094,049
[45] Date of Patent: Jul. 25, 2000

[54] FAST ADIABATIC PULSES

[75] Inventors: Daniel Rosenfeld, Haifa, Israel; Yuval Zur, Fort Collins, Colo.; Shimon L. Panfil, Haifa, Israel

[73] Assignee: General Electric Company, Waukesha, Wis.

[21] Appl. No.: 08/883,124

[22] Filed: Jun. 26, 1997

[30] Foreign Application Priority Data

Sep. 10, 1996 [IL] Israel .......................................... 119233

[51] Int. Cl.[7] ....................................................... G01V 3/00
[52] U.S. Cl. ............................ 324/307; 324/309; 324/314
[58] Field of Search ..................................... 324/307, 309, 324/314

[56] References Cited

U.S. PATENT DOCUMENTS

| | | | |
|---|---|---|---|
| 4,695,799 | 9/1987 | Hardy et al. ............................... | 324/307 |
| 4,914,392 | 4/1990 | Ugurbil et al. ........................... | 324/309 |
| 4,988,947 | 1/1991 | Ugurbil et al. ........................... | 324/307 |

OTHER PUBLICATIONS

Rosenfeld, Daniel, and Zur, Yuval, "A new adiabatic inversion pulse", Magnetic Resonance in Medicine, vol. 36 (1996), pp. 124–136.

Thomas E. Skinner and Pierre–Marie L. Robitaille, "General Solutions for Tailored Modulation Profiles in in Adiabatic Excitation", Journal of Magnetic Resonance 98:14–23 (1992).

Robin A. de Graaf, Klaas Nicolay and Michael Garwood, "Single–Shot, B1–Insensitive Slice Selection with a Gradient–Modulated Adiabatic Pulse, BISS–8", Magnetic Resonance in Medicine 35:652–657 (1996).

D. Rosenfeld, S. L. Panfil and Y. Zur, "Design of Adiabatic Pulses for Fat–Suppression Using Analytic Solutions of the Bloch Equation", Magnetic Resonance in Medicine 37:793–801 (1997).

D. Rosenfeld, S. L. Panfil and Y. Zur, "Analytic Solutions of the Bloch Equation Involving Asymmetric Amplitude and Frequency Modulations", Physical Review A, 54:2439–2443 (1996).

Daniel Rosenfeld and Yuval Zur, "A New Adiabatic Inversion Pulse", Magnetic Resonance in Medicine, 36: pp.124–136 (1996).

Rosenfeld and Y. Zur, Magnetic Resonance in Medicine, 36: 401, (1996).

Steven Conolly, Dwight Nishimura and Albert Macovski, "Variable Rate Selective Excitation", Journal of Magnetic Resonance, 78: 440–458 (1988).

C.P. Slichter, "Principles of Magnetic Resonance," 3rd ed. Springer–Verlag, Berlin, 1992, pp33–35.

Jerzy Szumowski, Jane K. Eisen, Simon Vinitski, Peter W. Haake and Donald B. Plewes, "Hybrid Methods of Chemical–Shift Imaging", Magnetic Resonance in Medicine, 9:379–388, (1989).

(List continued on next page.)

*Primary Examiner*—Christine K. Oda
*Assistant Examiner*—Tiffany A. Fetzner
*Attorney, Agent, or Firm*—Fenster & Company Patent Attorneys, Ltd.

[57] ABSTRACT

New methods of generating optimal inversion pulses and adiabatic pulses in magnetic resonance imaging are disclosed. Trajectories, maximum sweep rates, and velocity profiles are used in defining an optimal pulse, over support regions. Adiabatic pulses are optimized by using the trajectory as a constraint of optimization, but selecting trajectories with velocity profiles, without using the adiabatic condition as a constraint for optimizing the velocity profile. A method or inverting MR spins substantially, independently of the pulse duration, by selecting a transition width between 1.4 and 1.9 and dividing that width by the pulse duration is disclosed; and A new method of inverting adiabatic, MR, amplitude modulated spins, with a trajectory defined by sin $\alpha$/cos $\alpha$, where $\alpha < 0.9$ and at least 50% of the trajectory is outside, in a z-x rotating frame of reference that rotates at the instantaneous frequency of the RF pulse is also taught.

35 Claims, 5 Drawing Sheets

OTHER PUBLICATIONS

M.S. Silver, R.I. Joseph, D.I. Hoult, "Selective Spin Inversion in Nuclear Magnetic Resonance and Coherent Optics through an Exact Solution of the Bloch–Riccati Equation", Physical Review A, 31: 2753–2755,(1985).

A. Bambini and P.R. Berman, "Analytic Solution to the Two–State Problem for a class of Coupling Potentials," Physical Review, 23:No.5: 2496–2501 (1981).

D. Rosenfeld, S. L. Panfil and Y. Zur "Optimization of Adiabatic Selective Pulses," Journal of Magnetic Resonance, 126:221–228 (1997).

Thomas E. Skinner and Pierre–Marie L. Robitaille, "Adiabatic Excitation Using sin2 Amplitude and cos2 Frequency Modulation Functions," Journal of Magnetic Resonance Series A, 103: 34–39, (1993).

FAST ADIABATIC PULSES

FIELD OF THE INVENTION

The present invention relates to the design of adiabatic pulses for MRI (Magnetic Resonance Imaging) and in particular to an adiabatic pulse having a substantially half-rectangle trajectory.

BACKGROUND OF THE INVENTION

Magnetic resonance imaging is based on the process of inverting the spins of atoms which are situated in a strong axial magnetic field and then measuring the electromagnetic radiation of the atoms, as the spins return to a more relaxed state. A practical MRI device requires the ability to selectively invert a narrow slice of a subject, in a short period of time and using a low dose of RF radiation. The usual manner of inversion includes applying a z-gradient magnetic field to the subject so that each slice of the subject has a different Larmor frequency and irradiating the subject with an RF radiation pulse, so that only the spins in one of these slices are inverted. As higher strength magnetic fields are used for MRI imaging, the amount of RF energy absorbed by the body is higher. It is therefore important to limit the amount of radiation to which the subject is exposed. Further, in many MRI devices, the peak RF amplitude is limited. Usually, there is a tradeoff made between the pulse duration and the RF amplitude.

The relationship between the RF radiation, the magnetic field and the inversion of the spins is described by the Bloch equations, for which there are only a small number of known analytical solutions.

When an RF electromagnetic field is applied to a spin which is already in a strong static magnetic field, the RF magnetic field affects the spin. The RF field is very much smaller than the static field, so the RF field is usually described as rotating in the plane perpendicular to the field direction of the static magnetic field (the effect of the component in the static field direction is negligible). The effect of the RF field on the spins is most conveniently described in a rotating frame of reference, having three perpendicular axes, Z, Y and X. The Z axis is aligned with the main magnetic field denoted by $M_z$. The X axis is aligned with the RF field and the Y axis is perpendicular to both the X and Z axes. The entire frame of reference rotates around the Z axis at the instantaneous angular (frequency) of the RF pulse. Both X and Z axes use units of frequency, such that all magnetic fields $\vec{B}$ are represented by vectors $\gamma\vec{B}$, where $\gamma$ is the gyro-magnetic resonance coefficient for the spin (type of species thereof).

The effective magnetic field to which a spin is subjected as a result of the RF field is preferably defined as a vector in the rotating frame of reference. The magnitude of the Z component of the vector is equal to the frequency difference between the RF field frequency and the Larmor frequency of the spin. The magnitude of the X component is equal to the instantaneous amplitude of the RF field. It should be appreciated that in a uniform Z directed field, all the spins are located at the same Z coordinate. When a gradient magnetic field is applied, each spin has a different Larmor frequency and, hence, a different Z coordinate.

Typically, the net magnetization of a group of spins is treated as a single vector value, called the magnetization vector. Thus, the effect of an inversion pulse is to invert the magnetization vector in a slice of tissue. FIG. 1 is a graph of a typical inverted slice profile in which a nomalized magnetization is shown as a function of an off-resonance frequency. The slice includes an in-slice region, which is inverted by the inversion pulse, an out-of-slice region which is not inverted by the pulse and a transition region where the post-inversion magnetization varies between +1 (not inverted) and −1 (inverted). The magnetization values are normalized to the equilibrium magnetization, $M_0$. For convenience, the in-slice region is usually depicted as centered around the magnetization axis. The width of the slice (SW) is usually measured between the two points where the post-inversion magnetization vector is zero. The slice width is measured in units of frequency, which reflect the relationship between the inversion and the Larmor frequency. For convenience, $C_o$ is defined to be half the transition width.

One important type of inversion pulse is an adiabatic pulse. Inversion by adiabatic pulse is less affected by inhomogenities of the RF field amplitude than is inversion by other types of inversion pulses. An adiabatic pulse uses the following mechanism: An effective magnetization of the RF radiation field is initially aligned with the main field magnetization axis ($+M_z$) direction and is slowly changed until it is aligned in the direction opposite the main field magnetization ($-M_z$). If the rate of change of the effective magnetization vector is gradual enough, the magnetization vector will track the effective magnetization of the RF field and will be inverted when the effective magnetization vector becomes aligned with the −Z axis. The adiabatic condition (described below) describes the conditions under which the rate of change of the vector is sufficiently gradual to permit tracking. The motion of the effective magnetization is characterized by its "trajectory", which is the path of the tip of the effective magnetization vector and its "velocity profile", which describes the instantaneous rate of motion of the effective magnetization vector along its trajectory.

FIG. 2 is a graph showing the trajectory of a typical adiabatic pulse in the Z-X plane. The effective magnetization vector of the pulse starts out aligned with the +Z direction and moves along a half ellipse in the Z-X plane until it becomes aligned with the −Z direction. It should be noted that the trajectory shown in FIG. 2 is only correct for spins at the center of the slice. For all other spins, the shown trajectory is shifted by an amount equal to the difference between the Larmor frequency of the spin and the Lartnor frequency at the slice center. For each point P along the trajectory, which indicates an instantaneous position of the effective magnetization vector, x is the instantaneous RF amplitude and z is the instantaneous RF synthesizer frequency. For each spin which is affected by the adiabatic pulse, a vector connecting the spin and point P is the effective field vector, having a magnitude r. $\theta$ is defined as the angle between r and the X axis. In order for the rate of change of the vector to be sufficiently gradual to permit tracking, the motion must satisfy the following (adiabatic) condition, $\Gamma = r/|\dot\theta| \gg 1$, where $\Gamma$ is an adiabatic parameter which describes this ratio. For the same magnetization vector traversing a given trajectory at a given rate of motion, different spins will see different angular velocities. Since r and $\dot\theta$ are different for each spin, the adiabatic parameter may ensure tracking for one group of spins but not for another, even at the same point P.

As can be appreciated, if $\dot\theta$ is larger, the pulse will be shorter, however, the adiabatic parameter will be smaller, so tracking may break down and not be possible. In some MRI imaging sequences, time is of essence, so a short inversion pulse is desired.

One of the most efficient (fast, low peak RF amplitude and adiabatic for a wide range of RF amplitudes) inversion pluses in the prior art is the sech/tanh pulse. The first term (sech) defines the X component of the magnetization vector and the second term (tanh) describes the Z component. The trajectory of the sech/tanh pulse is a half ellipse in the Z-X plane.

"General Solutions for Tailored Modulation Profiles in Adiabatic Excitation", by Thomas E. Skinner and Pierre-Marie L. Robitaille, published in the *Journal of Magnetic Resonance* 98, pp. 14–23 (1992), describes an inversion pulse having a triangular trajectory. FIG. 3 shows an example of such a trajectory.

"Single-Shot, B1-Insensitive Slice Selection with a Gradient-Modulated Adiabatic Pulse, BISS-8", by Robin A. de Graaf, Klaas Nicolay and Michael Garwood, published in *Magnetic Resonance in Medicine* 35:652–657 (1996), describes a method for generating an optimal slice-selection pulse, named BISS-8, having an adjustable flip angle. A main benefit of the BISS-8 pulse is that it does not scramble the phase of the selected slice (which most adiabatic pulses do), so it can also be used for 180 refocusing in spin-echo imaging. The BISS-8 pulse requires much more amplitude than comparable pulses. However, the peak required amplitude is lower than comparable pulses. In addition, both the gradients and the RF frequency are modified during a BISS-8 pulse.

SUMMARY OF THE INVENTION

It is an object of some embodiments of the present invention to provide an adiabatic inversion pulse having a shorter duration than prior-art adiabatic pulses.

It is another object of some embodiments of the present invention to provide an adiabatic inversion pulse having substantially independently selectable transition widths and bandwidths.

It is a further object of some embodiments of the present invention to provide an analytically derived adiabatic pulse which is easily modified to meet different design constraints. In a preferred embodiment of the present invention, the adiabatic pulse is defined in a parametric manner.

The inventors of the present invention have determined that an adiabatic pulse having a substantially rectangular trajectory can be made of a shorter duration than a pulse having a half-ellipse shaped trajectory, such as a sech/tanh pulse which is known in the art. A pulse in accordance with a preferred embodiment of the invention includes a horizontal segment, a vertical segment and a short curved segment connecting the vertical and horizontal segments. Preferably, both the trajectory and its derivatives are continuous, to ensure tracking. The terms rectangular pulse and half-rectangle trajectory pulse are used interchangeably in this specification and denote an adiabatic RF pulse having a substantially half-rectangle trajectory, with, preferably, rounded corners.

It should be appreciated that in a half-rectangle shaped trajectory, the radius (r) is always longer than (or equal to) that of a similar half-ellipse trajectory. It then follows directly from the adiabatic condition ($\Gamma = r/|\dot\theta| \gg 1$) that for similar values of $\Gamma$, the rate of change ($\dot\theta$) can be made larger, and thus, the pulse duration, shorter. Moreover, the peak RF amplitude of required by the half-rectangle pulse is no greater than that of a corresponding half-ellipse pulse.

In a preferred embodiment of the invention, the transition width ($2c_0$), slice width (SW) and duration (T) of a pulse are interrelated such that any two of these parameters of the pulse can be varied substantially independently of each other, with the pulse remaining adiabatic and efficient. Since the transition width is independently controllable from the bandwidth, a shorter inversion pulse can be obtained than is possible using a standard pulse, such as a tanh/sech pulse, albeit at the expense of increasing the transition width.

Another aspect of the present invention relates to an optimization method, including, selecting a trajectory and then determining an optimal rate of motion along the trajectory. Preferably, the trajectory is selected by minimizing the integral $\int |d\theta|/r$ to determine an optimal trajectory.

In a preferred embodiment of the invention, the rate of motion along the trajectory is determined responsive to a maximum rate of motion which satisfies the adiabatic condition for all the spins in the slice for each point P along the trajectory.

Preferably, an optimal velocity profile is determined and then the determined maximum rate of motion is used to scale the velocity profile. Alternatively or additionally, the rate of motion along the trajectory is numerically optimized.

In a preferred embodiment of the invention, the maximum rate of motion is determined for a mathematical support region which defines which portions should be inverted (the slice) and which not (out-of-slice). Preferably, the support region also includes a range of expected local RF field strengths, such that the pulse can be verified as adiabatic for the expected RF range. Typically, the support regions will be rectangular (Larmor frequency range x RF amplitude range). In a preferred embodiment of the invention, the support regions are non-rectangular.

In accordance with another preferred embodiment of the invention, an inversion pulse is obtained by projecting a rectangular trajectory pulse onto a different path shape, preferably, one intermediate a half rectangle and a half-ellipse. In a preferred embodiment of the invention, at least 50% of the trajectory is outside a trajectory described by a half ellipse. More preferably, at least 70% is outside and most preferably, at least 90% is outside. The percentages refer to an angular measure relative to the slice center, in which for each angular unit of the trajectory, the trajectory is considered to be outside a half-ellipse trajectory if the distance r is longer for the trajectory than for the half-ellipse trajectory.

When two trajectories are compared to determine the above relationship, they should be scaled to have the same slicewidth and the same peak RF amplitude. Typically, the maximum available peak RF amplitude is used so as to minimize the pulse duration. However, it should be noted that a half-rectangular trajectory can achieve the same inversion as a half-ellipse trajectory having a similar duration, but using a lower peak RF amplitude.

Alternatively to comparing a trajectory in accordance with a preferred embodiment of the invention to a half-ellipse trajectory, a trajectory of the invention may be compared to a parametric family of trajectories. A standard half-ellipse trajectory may be defined as a sin/cos trajectory. The parametric family of trajectories is defined as $\sin^\alpha/\cos^\alpha$ where $0 < \alpha < 1$. The extreme case where $\alpha \to 0$ is a rectangular trajectory. All of these trajectories are "outside" a half-ellipse trajectory. A trajectory in accordance with a preferred embodiment of the invention is preferably either the same as or mostly outside (50%, 70% or 90%) a $\sin^\alpha/\cos^\alpha$ trajectory. Preferably, $\alpha < 0.9$, more preferably, $\alpha < 0.6$, most preferably, $\alpha < 0.4$.

Another aspect of the present invention relates to magnetic resonance imaging devices employing an inversion pulse determined using the above optimization method.

Yet another aspect of the present invention relates to a method of applying an inversion pulse, including determining a desired inversion bandwidth, independently determining a desired transition width and applying an RF pulse having a predetermined peak RF amplitude and a minimum duration which yields the desired bandwidth and transition width.

A method of applying an inversion pulse in accordance with another preferred embodiment of the invention, includes determining a desired pulse duration and peak RF amplitude for the pulse, selecting a tradeoff between an inversion bandwidth and a transition width of the pulse and applying an RF inversion pulse which yields the selected tradeoff.

It should be appreciated that a pulse generated in accordance with the present invention may also be used for flipping spins by angles other than 180 degrees, such as by 90 degrees, especially for on-resonance excitation or as a part of a composite pulse.

There is therefore provided in accordance with a preferred embodiment of the invention, a method of inverting spins for magnetic resonance imaging, comprising:

subjecting the spins to a strong magnetic field; and irradiating the spins with an adiabatic RF pulse having a trajectory, wherein said trajectory comprises, in a Z-X rotating frame of reference which rotates at the instantaneous frequency of the RF pulse:

a substantially horizontal segment;

a substantially vertical segment; and a curved segment connecting the horizontal segment and the vertical segment. Preferably, the trajectory further comprises a second horizontal segment and a second curved segment connecting the vertical segment and the second horizontal segment.

Alternatively or additionally, the RF pulse is analytically described. Alternatively or additionally, an adiabatic parameter is maintained at a minimum value which ensures tracking for a predefined support region of the spins, for substantially the entire trajectory. Preferably, the minimum value is determined based on an expected range of RF field inhomegeneities at the spins.

There is also provided in accordance with a preferred embodiment of the invention, a method of inverting spins for magnetic resonance imaging, comprising:

subjecting the spins to a strong magnetic field;

selecting a desired duration of an inversion pulse;

selecting a transition width of said pulse, which width is between 1.4 and 1.9 divided by the duration and which is otherwise substantially independent of said duration;

analytically generating an adiabatic RF pulse having the desired duration and the desired transition width; and inverting the spins with the generated RF pulse, by irradiating the spins with the pulse.

Preferably, the transition width is less than 1.7 divided by the duration. More preferably, the transition width is less than 1.5 divided by the duration.

There is also provided in accordance with yet another preferred embodiment of the invention a method of inverting spins for magnetic resonance imaging, comprising:

subjecting the spins to a strong magnetic field; and irradiating the spins with an adiabatic RF pulse, wherein, said adiabatic pulse is a projection of an adiabatic pulse having a substantially rectangular trajectory.

There is also provided in accordance with yet another preferred embodiment of the invention a method of inverting spins for magnetic resonance imaging, comprising:

subjecting the spins to a strong magnetic field;

selecting a desired bandwidth to invert;

selecting a desired duration of an inversion pulse, which duration is less than 90% of the duration of a shortest possible sech/tanh pulse which achieves an inversion of the desired bandwidth under similar peak RF amplitude limitations; analytically generating an adiabatic RF pulse having the selected duration and selected bandwidth; and inverting the spins with the generated RF pulse, by irradiating the spins with the pulse.

Preferably, said duration is less than 70% of the duration of the sech/tanh pulse. More preferably, said duration is less than 50% of the duration of the sech/tanh pulse.

There is also provided in accordance with yet another preferred embodiment of the invention, a method of inverting spins for magnetic resonance imaging, comprising:

subjecting the spins to a strong magnetic field; and irradiating the spins with an adiabatic RF pulse having a trajectory, wherein at least 50% of said trajectory, in a Z-X rotating frame of reference which rotates at the instantaneous frequency of the RF pulse, is outside a trajectory defined by $\sin^\alpha/\cos^\alpha$, wherein, $\alpha<0.9$.

Preferably, $\alpha<0.7$. More preferably, $\alpha<0.5$. Optionally, $\alpha<0.4$.

Alternatively or additionally, at least 50% comprises at least 70%. More preferably, at least 50% comprises at least 90%.

There is also provided in accordance with another preferred embodiment of the invention, a method of generating an optimal inversion pulse, comprising:

defining at least one support region, including at least one in-slice region;

selecting a trajectory;

determining, for each point P along the trajectory, the maximum sweep rate which ensures tracking over the at least one support region; and generating a velocity profile from the determined maximum sweep rates.

In a preferred embodiment of the invention, the velocity profile is analytically defined. Alternatively or additionally, the trajectory is a half-ellipse trajectory. Alternatively, the trajectory is a half-rectangle trajectory.

Alternatively or additionally, generating a velocity profile comprises searching for a minimum adiabatic parameter which ensures tracking over all the at least one support region.

In a preferred embodiment of the invention, the method includes optimizing the velocity profile without taking into account the adiabatic condition.

Alternatively or additionally, the at least one support region comprises at least two out-of slice support regions. Alternatively, the at least one support region comprises only one out-of slice support region.

Alternatively or additionally, determining the maximum sweep rate comprises finding a point in the support region having a minimum adiabatic parameter. Preferably, finding a point comprises analytically finding a point, at least in one dimension of the support region.

Alternatively or additionally, said support regions have a first extent determined by the slice profile and a second extent determined by an expected RF amplitude range. In a preferred embodiment of the invention, the support regions are non-rectangular.

Alternatively or additionally, the method comprises setting a distance between the support regions, responsive to a desired transition width.

There is also provided in accordance with a preferred embodiment of the invention, a method of optimizing an adiabatic inversion pulse, comprising:

selecting a trajectory having a velocity profile; and optimizing the velocity profile, along the trajectory and without using the adiabatic condition as a constraint, wherein, the trajectory is a constraint of the optimization.

Preferably, optimizing along the trajectory comprises optimizing using optimal control methods. Alternatively or additionally, optimizing along the trajectory comprises constraining the velocity profile to allow only forward motion along the trajectory.

Alternatively or additionally, the trajectory is a substantially half-rectangular trajectory.

There is also provided in accordance with a preferred embodiment of the invention, a method of inverting spins for magnetic resonance imaging, comprising, applying an inversion pulse produced by any of the above described pulse generation techniques There is further provided in accordance with a preferred embodiment of the present invention, apparatus for magnetic resonance imaging utilizing an inversion method according to any of the inversion methods described above and/or which radiates an RF pulse generated according to any of the above described methods of generating RF pulses.

There is also provided in accordance with a preferred embodiment of the invention an RF pulse generated according to any of the above described methods of generating an RF pulse.

There is provided in accordance with a preferred embodiment of the invention, an adiabatic RF inversion pulse having a trajectory, which when described in a Z-X rotating frame of reference which rotates at the instantaneous frequency of the RF pulse, comprises:

a substantially horizontal segment;

a substantially vertical segment; and a curved segment connecting the horizontal segment and the vertical segment.

BRIEF DESCRIPTION OF THE DRAWINGS

The invention will be more clearly understood by the following detailed description of preferred embodiments of the invention, taken together with the drawings in which.

DETAILED DESCRIPTION OF THE PREFERRED EMBODIMENTS

One aspect of the present invention relates to a method of optimizing an inversion pulse. The method includes two steps:

(a) selecting a trajectory; and (b) selecting a fastest velocity profile for the trajectory, which will still ensure inversion in the slice. Preferably, the fastest profile is determined by solving the Bloch equations for different trial velocity profiles and selecting the fastest velocity profile which still ensures inversion. In addition, in order to ensure tracking, both the trajectory and its derivatives are preferably constrained to be continuous. Preferably, at least the first derivative is continuous.

Figure 4:
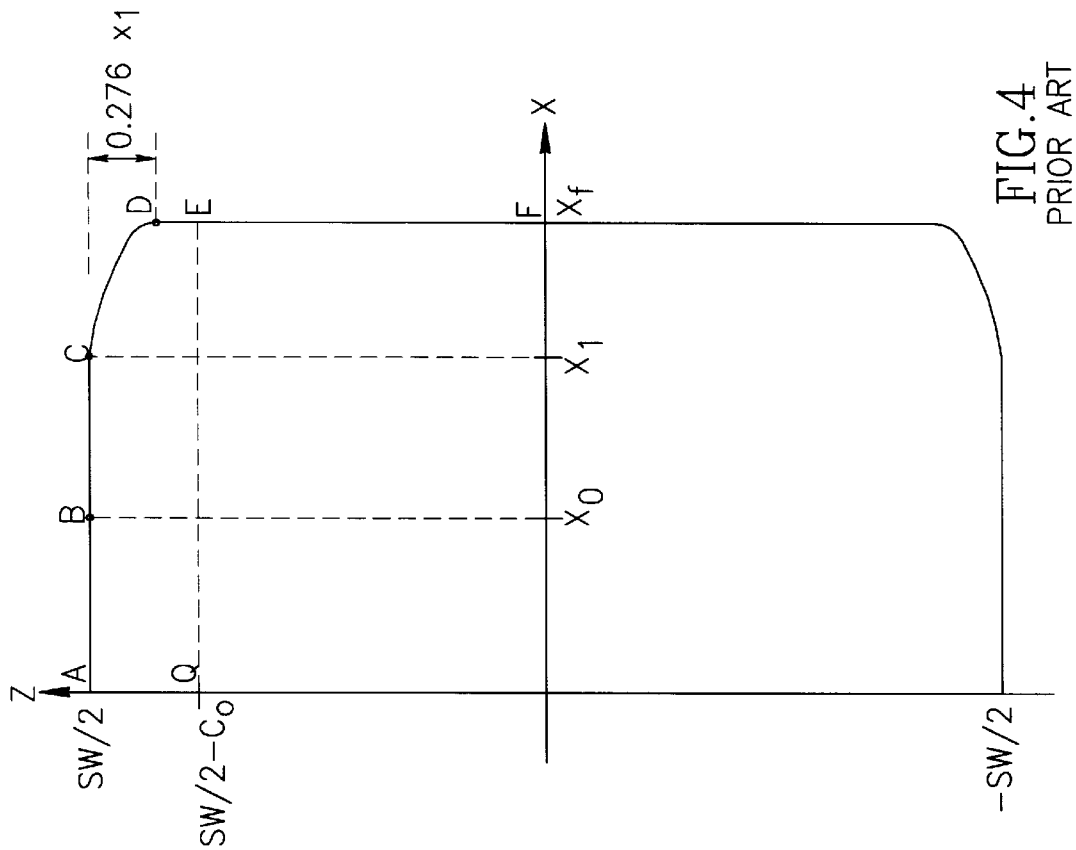
FIG. 4 is a graph of a trajectory of a preferred prior art, substantially rectangular inversion pulse as described herein.
Figure 3:
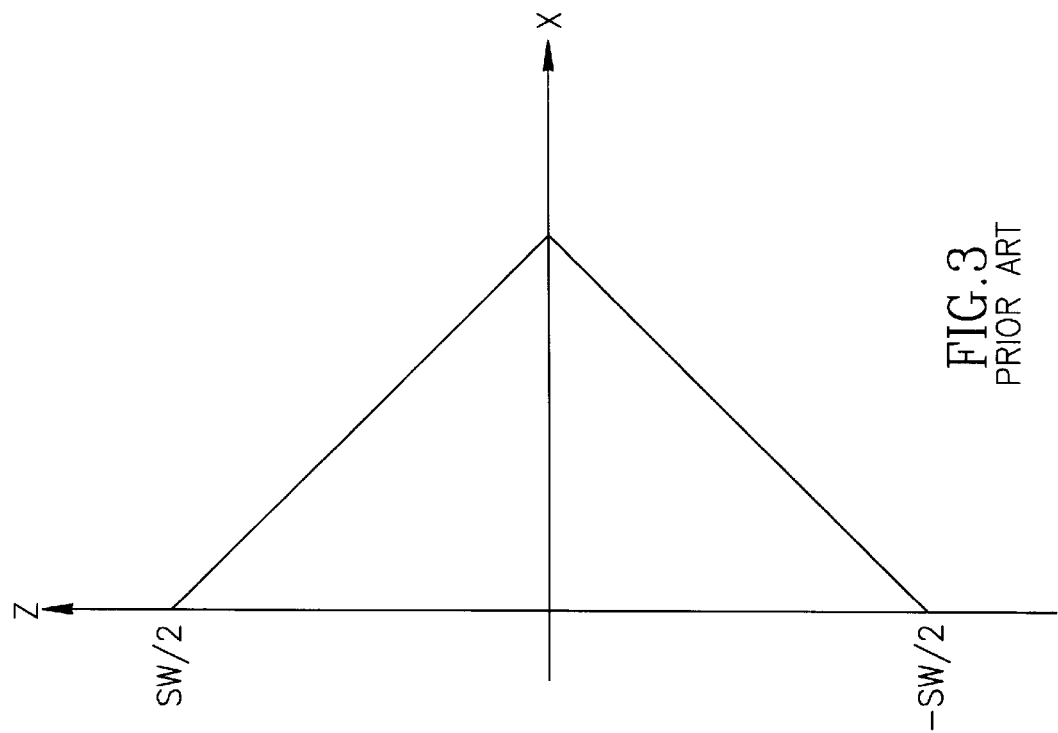
FIG. 3 is a graph of a prior art triangular trajectory pulse.

FIG. 4 is a graph of an optimal trajectory in accordance with a preferred embodiment of the invention. The trajectory is preferably symmetrical and each half preferably comprises a substantially horizontal segment AC, a substantially vertical segment DF and a curved segment CD bridging the horizontal segment and the vertical segment. U.S. patent application Ser. No. 08/916,390, "Frequency Selective Pulse", filed Aug. 23, 1997 by applicant Elscint LTD., the disclosure of which is incorporated herein by reference "Design of Adiabatic Pulses for Fat-Suppression Using Analytic Solutions of the Bloch Equation", by D. Rosenfeld, S. L. Panfil and Y. Zur, in *Magnetic Resonance in Medicine* 37:793–801 (1997) and "Analytic Solutions of the Bloch Equation Involving Asymmetric Amplitude and Frequency Modulations", by D. Rosenfeld, S. L. Panfil and Y. Zur, in *Physical Review A,* Vol. 54, pp. 2439–2443 (1996), the disclosures of which describe the use of non-symmetrical pulses, especially for selectively inverting fat tissue. "A New Adiabatic Inversion Pulse", by Daniel Rosenfeld and Yuval Zur, published in *Magnetic Resonance in Medicine,* 36:124–136 (1996), the disclosure of which includes mathematical analyses of the trajectory shown in FIG. 4.

Referring back to FIG. 2, each group of spins along the Z axis experiences a different effective magnetization vector as a result of the RF inversion pulse. For an arbitrary spin having a Larmor frequency $\omega_0$ and an arbitrary point P along the trajectory, the effective magnetic field has a magnitude of r and a direction $\theta$. The adiabatic parameter is given by $\Gamma = r/|\dot\theta|$. $\Gamma$ obtains a minimal value with respect to an arbitrary point $y^P_{min}$ along the Z axis (which may be other than $\omega_0$). If at point $y^P_{min}$ the adiabatic condition is fulfilled (for point P of the trajectory) it will also be fulfilled for all other points (of the in-slice region) along the Z axis, since, by definition, $\Gamma$ will be larger for those points. Thus, by ensuring tracking for spins at $y^P_{min}$ for every point P of the trajectory, tracking is established for all the spins in the slice.

Thus, in a preferred embodiment of the invention, tracking for each point P is assured by setting $\Gamma(y=y^P_{min})$ to a value $\gamma_0$ which is sufficient to ensure adiabatic inversion. The value of $\gamma_0$ depends on whether the pulse parameters and the modulation functions are expressed in frequency units (Hz) or in units of angular frequency (rad/s). When expressed in frequency units (as in the instant application), $\gamma_0$ is smaller by a factor of $2\pi$ than when expressed in units of angular frequency. For this reason, $\gamma_0$ is shown as smaller than 1, even though this would appear to violate the adiabatic condition. If $\gamma_0$ is increased, the tracking is improved, but the pulse duration is extended. It will therefore be appreciated that a minimal value for $\gamma_0$ is desirable. In accordance with a preferred embodiment of the invention, a given trajectory/velocity profile pair is optimized by multiplying the entire velocity profile by a constant such that $\gamma_0$ is a minimal value which ensures tracking. $\gamma_0 = r/|d\theta|$ (where r and $d\theta$ defined by P and $y^P_{min}$, so the pulse duration may be written as $$T = \int dt = \gamma_0 \int \frac{|d\theta|}{r}.$$

In a preferred embodiment of the invention, a constant value of $\gamma_0$ is selected for the entire trajectory. The value of $y^P_{min}$ is determined analytically and the integral $\int |d\theta|/r$ is minimized to determine the trajectory. Thereafter, a minimum value of $\gamma_0$ which ensures inversion, is selected, i.e., $\gamma_0$ is a time scale constant. Alternatively, a different value of $\gamma_0$ may be selected for each portion of the trajectory. Thus, a fast trajectory is combined with a fast velocity profile to yield a short duration pulse.

Referring back to FIG. 4, a pulse in accordance with a preferred embodiment of the invention may be analytically defined as comprising of different segments, AB, BC, CD and DF. The following equations were derived analytically by minimizing the above integral and they describe both the trajectory and the general velocity profile for the trajectory. For convenience, a parameter t in the equations is assumed to be zero at the start of each segment. Segment AB is a horizontal segment of the trajectory which has a constant adiabatic parameter with respect to a point Q, which is on the border between the in-slice region and the transition region:

$$x_{AB}(t) = \frac{c_0}{\sqrt{\left(\frac{\gamma_0}{c_0 t}\right)^2 - 1}} \tag{1}$$

$$z_{AB}(t) = SW/2 \tag{2}$$

Point B, having an X coordinate of $x_0$, is defined as the point where the spin with $y^P_{min}$ enters the in-slice region, whereby $$x_0 = \sqrt{2} c_0 \tag{3}$$

The duration of segment AB is $$T_{AB} = \frac{\gamma_0}{c_0} \sqrt{\frac{2}{3}} \tag{4}$$

Section BC is a horizontal segment where $y^P_{min}$ is in the in-slice region, where $$\frac{1}{x_{BC}(t)} = \frac{1}{x_0} - \frac{t}{0.385 \gamma_0} \tag{5}$$

$$z_{BC}(t) = SW/2 \tag{6}$$

Point C is the start of the curved segment and starts at $$x_1 = \frac{x_f}{1.355} \tag{7}$$

where $X_f$ is the peak RF amplitude. The duration of segment BC is $$T_{BC} = \gamma_0 0.385 \left(\frac{1}{x_0} - \frac{1}{x_1}\right) \tag{8}$$

Segment CD is a curved segment which connects the horizontal portion of the trajectory at C and the vertical portion of the trajectory at D.

$$x_{CD}(t) = (1 + 2.63\tau - 2.87\tau^2 - 8.04\tau^3) x_1 \tag{9}$$

$$z_{CD}(t) = SW/2 + (0.064\tau - 7.62\tau^2 + 9.90\tau^3) x_1 \tag{10}$$

where $\tau$ is a dimensionless variable defined by $$\tau = \frac{x_1}{\gamma_0} t \text{ with } 0 \le \tau \le 0.2346 \tag{11}$$

The duration of segment CD is $$T_{CD} = \gamma_0 \frac{0.2346}{x_1} \tag{12}$$

and ZD is $$z_D = SW/2 - 0.276 x_1 \tag{13}$$

Segment DF is a vertical segment, where $$x_{DF}(t) = x_f \tag{14}$$

$$z_{DF}(t) = z_D - \frac{x_f^2}{\gamma_0} t \tag{15}$$

The duration of segment DF is $$T_{DF} = \gamma_0 \frac{z_D}{x_f^2} \tag{16}$$

Preferably, the maximum available $X_f$ is be used, as long as $$x_f \le 4.91 \frac{SW}{2} \tag{17}$$

The total duration of the pulse is twice the sum of the durations of the individual segments:

$$T = \gamma_0 \left(\frac{2.18}{c_0} + \frac{(SW/x_f) - 0.815}{x_f}\right) \tag{18}$$

It should be appreciated that the above described pulse is analytically and parameticly described and as such more amenable to adaptation to different MRI devices and imaging sequences. In particular, analytical pulses are easier to implement and adapt to a particular RF synthesizer than numerically defined pulses. The inventors have determined that the minimal value of $\gamma_0$ which renders satisfactory inversion is approximately $4/2\pi$. However, as described below, lower values of $\gamma_0$ are possible for at least portions of the trajectory.

Referring to Equation (18), a first unique property of a rectangular trajectory pulse such as that shown in FIG. 4 is that the slice width and the transition width may be individually controlled. Once a pulse duration and peak RF amplitude ($x_f$) are set the transition width ($2c_0$) and the slice width (SW) may be traded off, to a limit determined by equation (18). The segment AB of the trajectory controls transition width, while the segment BF controls the slice width. If, for a given pulse duration, the time along segment AB is decreased and the time along segment BF is increased, then the quality of tracking in the transition region will be reduced and the transition width will increase. Conversely, the quality of tracking in the in-slice region will increase, thereby ensuring inversion. Thus, in a very short pulse, the transition width may be sacrificed to assure inversion. In particular, shorter pulse durations than the prior art can be achieved at the expense of transition width, which in many cases is not as important a consideration as slice width or pulse duration, for example, as described with reference to FIG. 6, below. In addition, when the RF peak amplitude is limited, transition width and/or slice width and peak RF amplitude can also be traded-off (preferably, according to equation 18).

In an extreme example, to invert the largest possible bandwidth in a given duration and using a given maximum RF amplitude, the transition width is sacrificed (allowed to increase). Since most of the pulse will be spent in the vertical portions of the trajectory, the first term of equation (18) should be minimized. This occurs when $x_0$ is equal to $x_1$ (see equation (8)). The resulting transition width is then $c_0=0.51x_f$. Also, $c_0<=SW/2$, since the transition region cannot exceed the inverted bandwidth. By substituting the transition width back into equation (18), $$SW = x_f \left( \frac{x_f}{\gamma_0} T - 3.36 \right) \quad (19)$$

which is an estimate of the maximum invertable bandwidth.

In the other extreme, to achieve a narrowest possible transition, the bandwidth may be sacrificed. Since most of the time is spent in the transition region AB, the first term of equation (18) will dominate the second term:

$$T \approx \gamma_0 \frac{2.18}{c_0} \Rightarrow c_0 \approx \gamma_0 \frac{2.18}{T} \quad (20)$$

It should be appreciated that in many cases the pulse duration is an important limitation, such as in $T_2$ imaging, where an RF pulse duration should be much shorter than the $T_2$ decay time. In some imaging sequences, using a shorter pulses significantly increases the efficiency of data collection. For example, in an inversion-recovery MRI sequence, using a shorter inversion pulse allows more image slices to be simultaneously imaged than by using a sech/tanh pulse.

Figure 5:
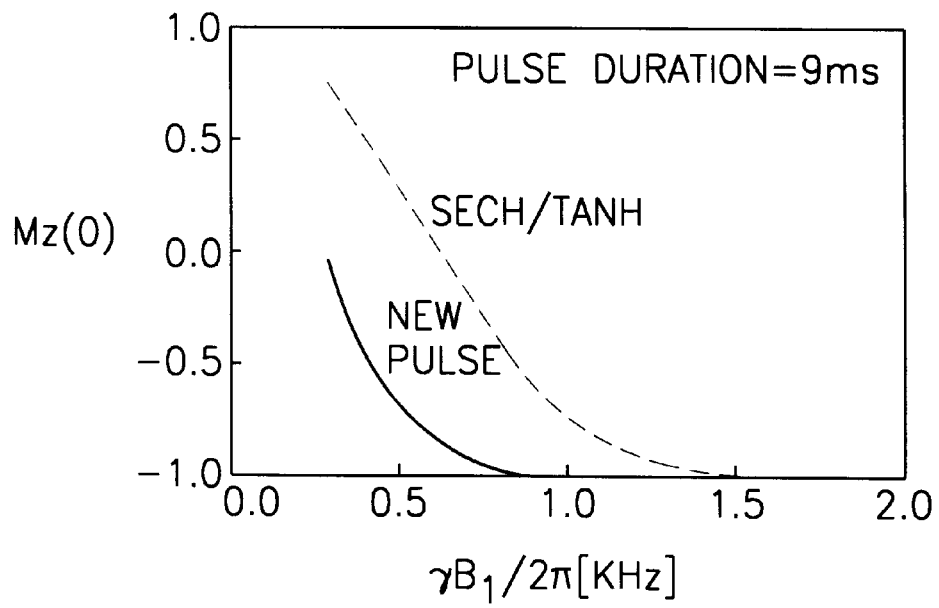
FIG. 5 is a graph illustrating the adiabatic performance of a rectangular trajectory pulse in accordance with a preferred embodiment of the invention.

FIG. 5 is a graph illustrating that a rectangular trajectory pulse in accordance with a preferred embodiment of the present invention requires a lower RF amplitude that a comparable sech/tanh pulse. The pulse duration is 9 ms, the slice width $SW/2\pi$ is 8 kHz and the value of $\gamma_0$ is $3.4/2\pi$. FIG. 5 plots the Z component of the final magnetization at the slice center as a function of the maximal RF amplitude ($\gamma B_1/2\pi$, which, as described above, is in units of frequency). Full inversion can be achieved at as low a field strength as 0.8 kHz for a rectangular trajectory as compared to 1.5 kHz for a sech/tanh pulse.

Figure 6:
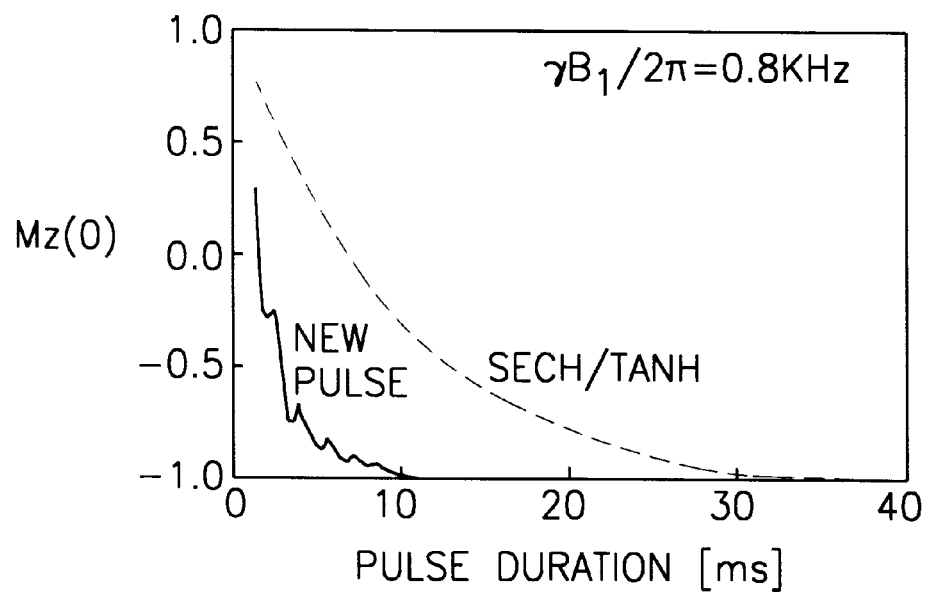
FIG. 6 is a graph illustrating the efficiency of a rectangular trajectory pulse in accordance with a preferred embodiment of the invention.

FIG. 6 is a graph illustrating the efficiency of a rectangular trajectory pulse in accordance with a preferred embodiment of the invention. For a slice width of 8 kHz and a maximum RF amplitude of 0.8 kHz, a rectangular trajectory pulse can achieve complete inversion (at the slice center) in less than one third the duration of an equivalent sech/tanh pulse.

It should be appreciated that as the strength of the static magnetic field increases, the absorption of RF by the body increases dramatically. This has the effect of reducing the maximum available RF amplitude (more is absorbed). In addition, the increase in magnetic loading of the patients body causes the RF to become more inhomogeneous. The specific absorption rate (SAR) of a pulse is an indication of the amount of RF energy absorbed by the subject's body.

The RF energy of a pulse of a duration T is proportional to $$\int_{-T/2}^{T/2} (\gamma B_1(t))^2 dt \quad (21)$$

The SAR of the pulse described with reference to FIG. 4 is (only) 1.18 times the SAR of a sech/tanh pulse, having a similar bandwidth, transition width and peak RF amplitude, but having a longer duration than the pulse shown with relation to FIG. 4.

Another aspect of the present invention relates to numerically optimizing the velocity profile of an adiabatic pulse without regard to the adiabatic condition. The use of a constant $\gamma_0$ for the entire trajectory may induce imperfections in the selected slice, in the form of sidelobes in the out of slice-region or ripples in the inverted region. In a preferred embodiment of the invention, instead of using a constant value of $\gamma_0$ for the entire trajectory, $\gamma_0$ is optimized along the trajectory. MRI pulse optimization is well known and the optimality is usually measured with respect to a cost functional which expresses a distance between the target magnetization $m_d(\omega_0)$ and the actual magnetization $m(\omega_0, T)$, e.g., $$J_d = \sum_{\omega_0} (m(\omega_0, T) - m_d(\omega_0))^2 \quad (22)$$

where the sum is over a range of Larmor frequencies, including the region of inversion. D. Rosenfeld and Y. Zur, Magnetic Resonance in Medicine, Vol. 36, p 401, (1996), describes an optimization method in which both amplitude and frequency modulation functions are optimized. The adiabaticity is incorporated into the optimization by enhancing the functional of equation (22) with an additional, adiabaticity-preserving term, the purpose of which is to maintain adiabaticity during the optimization process.

In a preferred embodiment of the present invention a functional is added to equation (22) which does not contain any adiabaticity-related portions. Only the rate of motion along the trajectory is optimized. It is assumed that adiabaticity is preserved by the following two restrictions: the trajectory is unchanged by the optimization and only forward motion (of the effective vector) along the trajectory is allowed. The optimization may also be performed to provide a pudse with a narrow transition region (suitable for fat suppression), to correct for defects which occur when a parametric pulse is taken to extreme values of its parameters (or beyond where it is supposed to be adiabatic).

Another aspect of the present invention relates to an expansion of the above described procedure for deriving an optimal velocity profile for the rectangular trajectory to a procedure for generating efficient pulses having rectangular or other trajectories. The pulses are tailor made for a given slice-inversion situation. In accordance with a preferred embodiment of the invention the pulse is designed to be adiabatic for a predetermined range of RF field strengths which are expected inside the patient's body. Thus, reducing the peak RF amplitude to that which is required to maintain adiabatic behavior in the regions having the lowest RF amplitude. One reason why adiabatic pulses are preferred is because an adiabatic pulse works well even when the RF field is not homogeneous. A typical adiabatic pulse will invert two spins equally well even if there is a factor of two between their local RF field strength. Briefly, increasing the available RF amplitude increases r more than it increases θ, so the adiabatic condition is maintained. Nevertheless, there are limits to the variability in field strength which can be accommodated for by an adiabatic pulse. In addition, as described above, the minimum amplitude which will ensure inversion is desired. In accordance with a preferred embodiment of the invention, if the range of effective magnetic field strengths is known in advance, it is possible to tune the pulse to these expected field strengths.

Figure 7A:
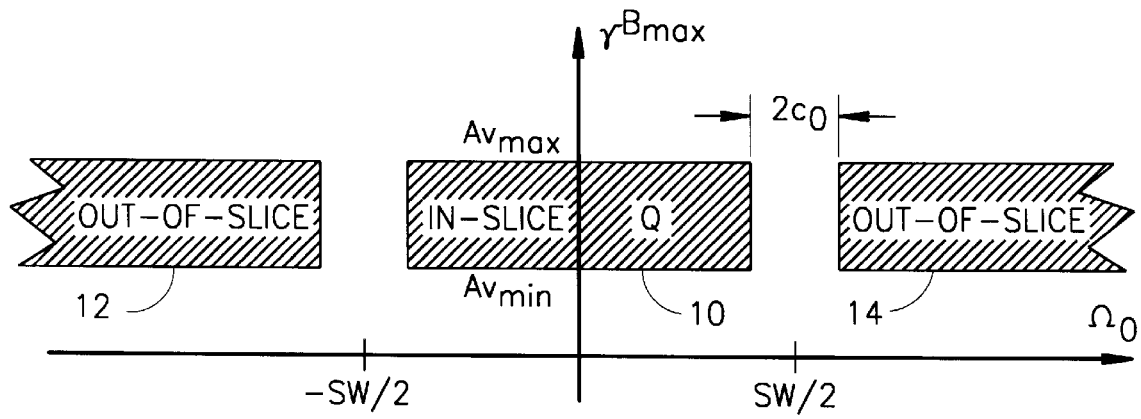
FIGS. 7A and 7B are illustrations of support regions for generating various optimal pulses, in accordance with preferred embodiments of the invention.

FIG. 7A illustrates a support region 10, corresponding to an in-slice region and support regions 12 and 14 corresponding to out-of-slice regions, all regions defined for a particular inversion pulse. In many cases, only the in-slice support region is required to determine an optimal velocity profile. The horizontal axis, $\Omega_0$, is a Larmor frequency axis. As shown in FIG. 7A, between Larmor frequencies $-SW/2+c_0$ and $SW/2-c_0$ the spins must be inverted by the pulse; frequencies under $-SW/2-c_0$ or over $SW/2+c_0$ must not be inverted by the pulse; and other frequencies, by definition, fall into the transition region, whereby they are partially inverted. The vertical axis, $\gamma^B{}_{max}$, is the RF amplitude axis. The vertical shaded extent of the support regions indicates the range of RF amplitudes for which the pulse is required to be adiabatic. In accordance with a velocity profile generating method according to a preferred embodiment of the present invention, a trajectory is selected and an optimal velocity profile along the trajectory is found such that the adiabatic condition be maintained for all points in the three support regions. Typically, an optimal velocity profile is one which is faster. Alternatively, a more optimal velocity profile can use a trajectory which requires a lower peak RF amplitude and achieves the same inversion in a similar period of time.

After the support regions are defined, a point $y^P{}_{min}$ (as defined above) is determined for each point P along the trajectory, under the constraint that the point $y^P{}_{min}$ must be inside one of the support regions (usually $y^P{}_{min}$ falls within the in-slice support region. The value of $\Gamma$ at $y^P{}_{min}$ is set (thereby setting the angular velocity at point P) to a constant $\gamma_0$, which is basically a time-scaling constant. A velocity profile for the trajectory is generated from the required velocity at each point P. The magnitude of $\gamma_0$ is preferably determined by searching for a value of $\gamma_0$ which ensures a satisfactory magnetization profile. The magnetization inversion is calculated by solving the Bloch equations (simulation) for different trial values of $\gamma_0$. The minimal $\gamma_0$ that can still render satisfactory inversion is finally selected. The search is preferably performed using a binary search method. In some cases this value of $\gamma_0$ might not ensure complete inversion at $y^P{}_{min}$.

$y^P{}_{min}$ may be found numerically. Once $\gamma_0$ is found, the velocity profile may be generated (numerically) from the values of $\Gamma$ at each $y^P{}_{min}$. However, in a preferred embodiment of the invention, described below, $y^P{}_{min}$ and/or the velocity profile are found using analytical methods, thereby requiring fewer computations and providing greater flexibility.

In a preferred embodiment of the invention the velocity profile is generated by integrating the following differential equation:

$$t(\eta) = \gamma_0 \int_{-\pi/2}^{\eta} d\eta' [f_m(\eta')]^{-1} \quad (23)$$

and then inverting the resulting function $t(\eta)$ to yield $\eta(t)$. $\eta(t)$ is a monotonic ascending function of t which varies from $-\pi/2$ to $+\pi/2$ and defines the velocity profile along the trajectory. For example, the sech/tanh pulse may be parametrized by:

$$x(t) = A\cos(\eta(t))$$

$$z(t) = \omega_c - B\sin(\eta(t)) \quad (24)$$

where A is the RF peak amplitude, B is SW/2 and $\omega_c$ is the Larmor frequency at the slice center. Each specific value of $\eta$ represents is associated with a specific point along the trajectory. $f_m(\eta)$, which is related to $\Gamma$, is a shorthand for the minimum value of a function $f(\eta,\Omega_0,v)$ for a given value of $\eta$ over a range of RF inhomogeneities v and a range of Larmor frequencies $\Omega_0$. This function f is defined in the following manner. Referring back to FIG. 2, for each point P along the trajectory and an arbitrary spin, r and $\theta$ are a function of x and y. The RF amplitude, x, is the applied RF amplitude $\omega_1$, scaled by v. In addition, both x and y are a function of $\eta(t)$. Thus:

$$x(t) = v\omega_1(\eta(t))$$

$$y(t) = \Delta\omega(\Omega_0, \eta(t)) \quad (25)$$

Thus, r and $\theta$ are (using a Cartesian to polar transformation):

$$r = \sqrt{v^2\omega_1^2 + \Delta\omega^2} \quad (26)$$

$$\theta = \tan^{-1}(\Delta\omega/v\omega_1)$$

The adiabatic parameter can be rewritten using equations (25) and (26) as:

$$\Gamma(\eta, \Omega_0, v) = \frac{r}{|\dot\theta|} = \frac{|v^2\omega_1^2 + \Delta\omega^2|^{\frac{2}{3}}}{v\dot\eta|\Delta\omega'\omega_1 - \Delta\omega\omega_1'|} \quad (27)$$

where $g' = dg/d\eta$ and $\dot g = dg/dt$; recalling tha $dg(\eta(t))|dt = g'\dot\eta$.

Since, by definition, $\Gamma \geq \gamma_0$, by reordering equation (27):

$$\dot\eta(t) \leq \frac{1}{\gamma_0} = \frac{|v^2\omega_1^2 + \Delta\omega^2|^{\frac{2}{3}}}{v|\Delta\omega'\omega_1 - \Delta\omega\omega_1'|} \equiv \frac{1}{\gamma_0} f(\eta, \Omega_0, v) \quad (28)$$

thereby defining f. $f_m(\eta)$ is the minimum of f for a particular value of $\eta$ (a specific point along the trajectory) over the support region. It may be expected that different values of $\eta$ will yield different minimum values of $f_m$. As a result of the relationship between $\dot\eta(t)$ and $f_m(\eta)$ in equation (28), $d\eta(t)/dt$ is shown to be a function of $\eta$ (and not t). Thus, $t(\eta)$ can be found from equation (23).

In some preferred embodiments of the invention $y^P{}_{min}$ is found by searching over the support regions and not by analytical derivation, since the support regions are usually irregular in shape. In the prior art it has usually (if not always) been assumed that that $y^P{}_{min}$ occurs at the synthesizer frequency of the point P. However, this is usually not the case. A preferred search method uses an analytically defined function $y^P{}_{min}$ to reduce the computational complexity of finding $f_m$.

An analytic expression for $y^P{}_{min}$, (the off-resonance frequency at which $f_m$ is minimized) for a single RF amplitude is:

$$y^P\min = x \frac{-3v + \sqrt{(3v)^2 + 8}}{4} \quad (29)$$

where, v is the absolute value of the slope of the trajectory at point P and where x is the x position (RF amplitude) of point P. It should be appreciated that $y^P_{min}$ is an implicit function of the peak RF amplitude, since changing the RF amplitude affects the slope, v, at each point P of the trajectory. Preferably, the range of RF amplitudes is divided into subsections. For each subsection, $y^P_{min}$ is determined. If $y^P_{min}$ fall outside the support regions, the two points in the neighboring support regions which are closest to $y^P_{min}$ are selected and the smaller value of f at the two points is used. Then, $f_m$ is determined by selecting the lowest value of f for all of the subsections. In an alternative preferred embodiment of the invention, $f_m$ is determined using a one-dimensional search technique, as known in the art, on the range of RF amplitudes. The one-dimensional search need only evaluate f, not its derivatives.

Figure 7B:
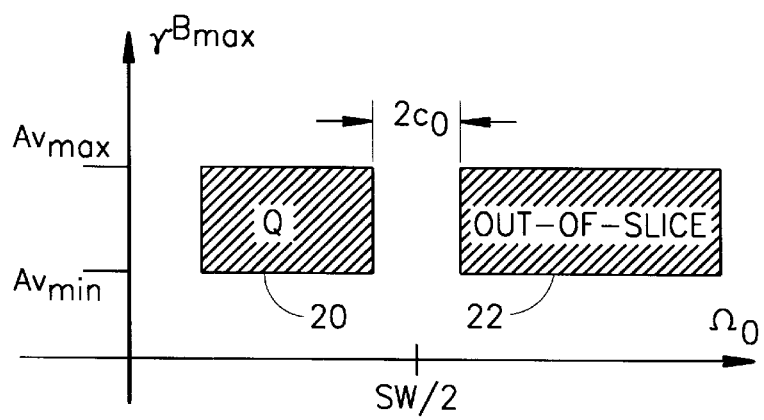

FIG. 7B illustrates a design of support regions for a fat suppression pulse. A special requirement of fat suppression pulses is that the entire transition region fit in the small frequency difference between fat and water. In a preferred embodiment of the invention, this requirement is met by designing support regions, whose only constraints are the width of the transitional region between an in-slice region 20 and an out-of-slice region 22 and that the support regions cover the spectral bandwidth of water and fat, respectively. In FIG. 7B the width constraint is the width $2c_0$. Of course, the desired range of RF amplitudes should also be defined. It should be noted that in FIG. 7B only one out-of-slice region is defined, since the most significant requirement in fat suppression is that the fat be inverted and the water not. There is generally no interest in the what happens at frequencies lower than the fat frequencies. In cases where there is such an interest, an addition out-of-slice support region may be defined. The fat suppression pulse is then determined in a manner similar to that described with respect to FIG. 7A.

A fat suppression pulse determined in this manner is more efficient than a comparable sech/tanh pulse, since only a narrow bandwidth is required, and the above described bandwidth/transition-width/RF amplitude tradeoff may be applied. Further, since only one transition region is important, the behavior of the pulse after that narrow transition is obtained is much less constrained. As a result, fat suppression pulses can have a portion which follows a half-ellipse trajectory, with an optimal velocity profile while the rest of the pulse can have a different trajectory, such as a straight line.

Figure 1:
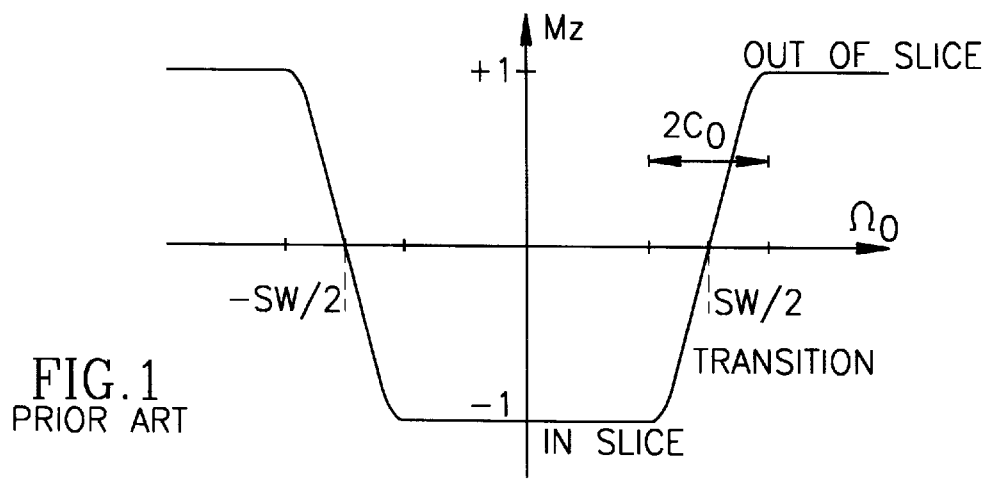
FIG. 1 is a graph showing a typical prior art (inversion) slice profile.
Figure 2:
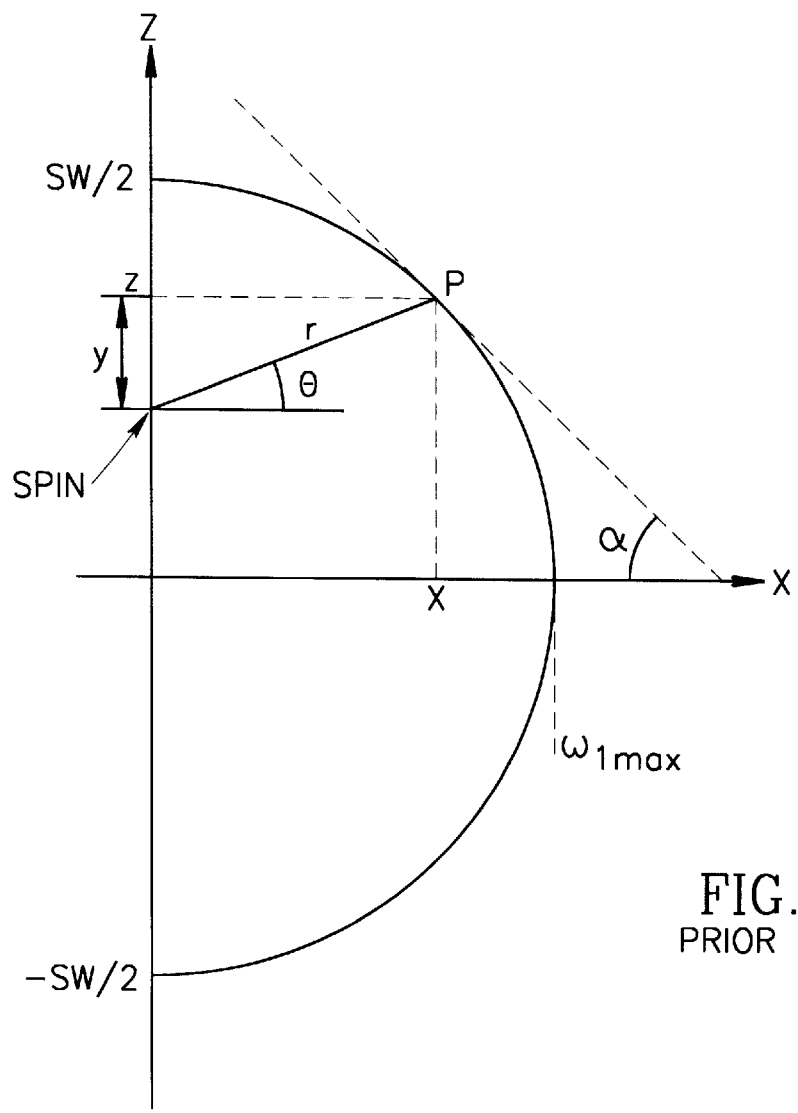
FIG. 2 is a graph showing a trajectory of a typical prior art adiabatic pulse.
Figure 8:
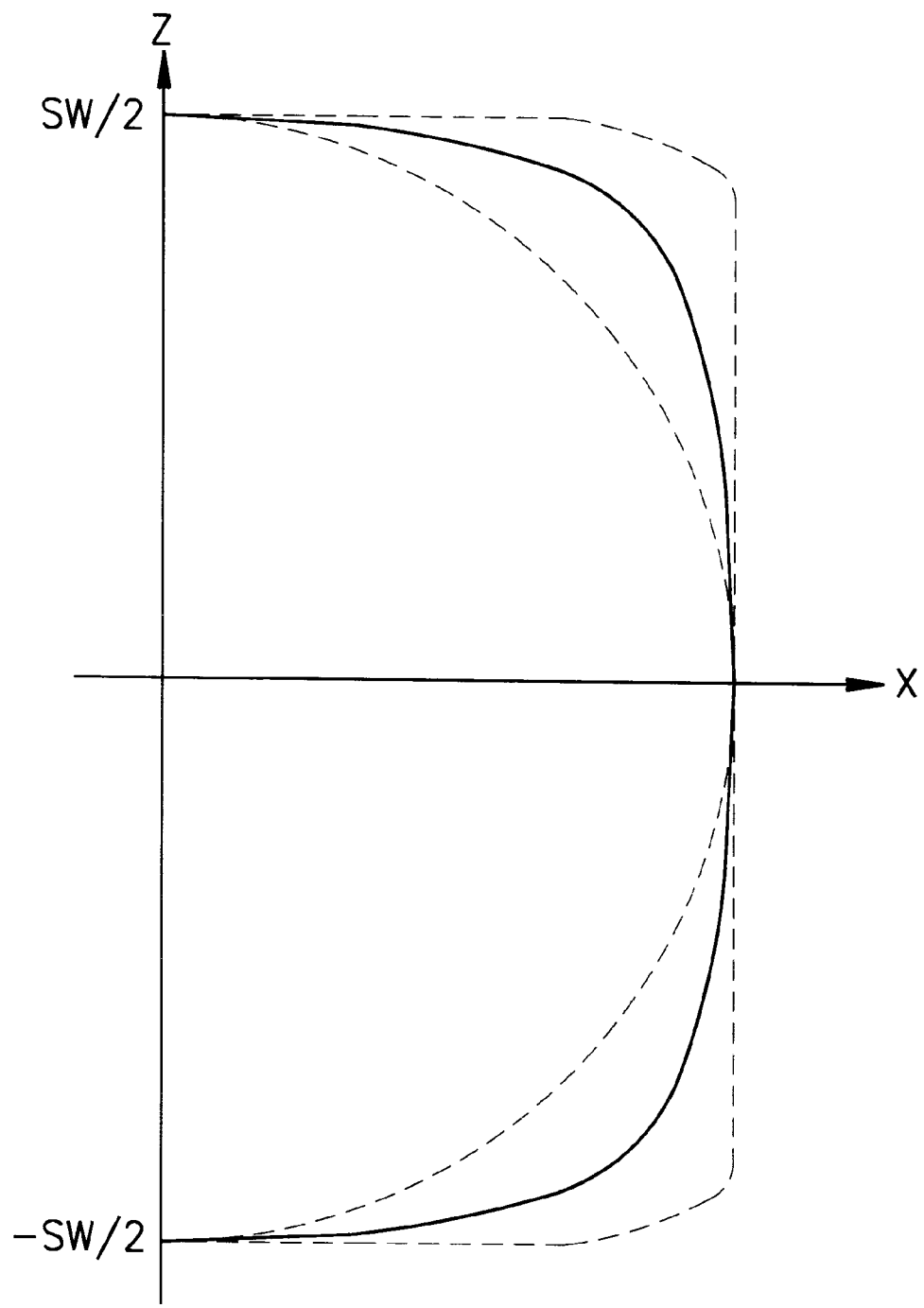
FIG. 8 is a schematic drawing of a projection of a rectangular trajectory pulse in accordance with a preferred embodiment of the invention.

It should be appreciated that the present invention is not limited to rectangular trajectory pulses as shown in FIG. 4. Rather, the inventors have determined that the properties of the pulse improve as the trajectory approaches the form of a rectangle. Thus, a less optimal, but still useful, pulse may be obtained by projecting the pulse onto a different trajectory, such as one intermediate a rectangle and an ellipse. Projection is described in "Variable Rate Selective Excitation", by Steven Conolly, Dwight Nishimura and Albert Macovski, in *Journal of Magnetic Resonance*, Vol. 78, pp. 440–458 (1988). FIG. 8 shows an example of such a projected trajectory which is intermediate a trajectory as shown in FIG. 4, in accordance with the present invention, and an elliptical trajectory, as show in FIG. 2. The trajectories of FIGS. 2 and 4 are shown as dotted lines. In addition, in accordance with other embodiment of the present invention, the velocity profile optimization technique may be applied to any trajectory. Alternatively, the rectangular trajectory may be used with other, possibly less optimal, velocity profiles. It should, however, be appreciated that projecting the trajectory decreases the parameter "r" by a certain factor for each point along the trajectory, thus, the duration T is typically extended by that factor, at each point.

A parametric family of trajectories, which are intermediate a half-ellipse and a half-rectangle, can be generated, such that they are faster than a half-ellipse trajectory. A standard half-ellipse trajectory may be defined as a sin/cos trajectory, for example as shown in equation (24). The parametric family of trajectories is defined as $$x(t) = A\cos^\alpha(\eta(t))$$

$$z(t) = \omega_c - B\sin^{\alpha(\eta(t))} \quad (30)$$

referred to herein as $\sin^\alpha/\cos^\alpha$ where $0<\alpha<1$. The extreme case where $\alpha \to 0$ is a half-rectangular trajectory. All of these trajectories are "outside" a half-ellipse trajectory. Preferably, $\alpha<0.9$, more preferably, $\alpha<0.6$, most preferably, $\alpha<0.4$.

In addition, it should be appreciated that the above described optimization methods are applicable to any trajectory, not only rectangular trajectories and can also both be sequentially applied. However, since many optimization methods are sensitive to the starting point, it is useful to start with a more efficient trajectory, i.e., a half-rectangular trajectory.

It will be appreciated by a person skilled in the art that the present invention is not limited by what has thus far been described. Rather, the scope of the invention is limited only by the claims which follow.

What is claimed is:

1. A method of inverting spins for magnetic resonance imaging, comprising:

subjecting the spins to a strong magnetic field;

selecting a desired duration of an inversion pulse;

substantially independently of said duration, selecting a transition width of said pulse, such that the width is between 1.4 and 1.9 divided by the duration;

analytically generating an adiabatic RF pulse having the desired duration and the desired transition width; and inverting the spins with the generated RF pulse, by irradiating the spins with the pulse.

2. A method according to claim 1, wherein said transition width is less than 1.7 divided the duration.

3. A method according to claim 1, wherein said transition width is less than 1.5 divided the duration.

4. A method according to claim 1, wherein analytically generating a pulse comprises analytically generating a pulse having a non-constant Rf amplitude.

5. A method of inverting spins for magnetic resonance imaging, comprising:

subjecting the spins to a strong magnetic field; and irradiating the spins with an amplitude modulated adiabatic RF pulse having a trajectory, wherein at least 50% of said trajectory, in a Z-X rotating frame of reference which rotates at the instantaneous frequency of the RF pulse, is outside a trajectory defined by $\sin^\alpha/\cos^\alpha$, wherein, $\alpha<0.9$.

6. A method according to claim 5, wherein said trajectory starts and ends with a substantially zero RF amplitude.

7. A method according to claim 5, wherein $\alpha<0.7$.

8. A method according to claim 5, wherein $\alpha<0.5$.

9. A method according to claim 5, wherein $\alpha<0.4$.

10. A method according to claim 5, wherein at least 50% comprises at least 70%.

11. A method according to claim 5, wherein at least 50% comprises at least 90%.

12. A method of generating an optimal inversion pulse, comprising:

defining at least one support region, including at least one in-slice region;

selecting a trajectory;

determining, for each point P along the trajectory, the maximum sweep rate which ensures tracking over the at least one support region; and generating a velocity profile from the determined maximum sweep rates.

13. A method according to claim 12, wherein the velocity profile is analytically defined.

14. A method according to claim 12, wherein the trajectory is a half-ellipse trajectory.

15. A method according to claim 12, wherein the trajectory is a half-rectangle trajectory.

16. A method according to claim 12, wherein generating a velocity profile comprises searching for a minimum adiabatic parameter which ensures tracking over all the at least one support region.

17. A method according to claim 12, comprising optimizing the velocity profile without taking into account the adiabatic condition.

18. A method according to claim 12, wherein said at least one support region comprises at least two out-of slice support regions.

19. A method according to claim 12, wherein said at least one support region comprises only one out-of slice support region.

20. A method according to claim 12, wherein determining the maximum sweep rate comprises finding a point in the support region having a minimum adiabatic parameter.

21. A method according to claim 20, wherein finding a point comprises analytically finding a point, at least in one dimension of the support region.

22. A method according to claim 12, wherein said support regions have a first extent determined by the slice profile and a second extent determined by an expected RF amplitude range.

23. A method according to claim 22, wherein said first extent represents a nod-zero slice width.

24. A method according to claim 22, wherein the support regions are non-rectangular.

25. A method according to claim 12, comprising setting a distance between the support regions, responsive to a desired transition width.

26. A method of optimizing an adiabatic inversion pulse, comprising:

selecting a trajectory having a velocity profile; and optimizing the velocity profile, along the trajectory without using the adiabatic condition as a constraint, wherein, the trajectory is a constraint of the optimization.

27. A method according to claim 26, wherein optimizing along the trajectory comprises optimizing using optimal control methods.

28. A method according to claim 27, wherein optimizing along the trajectory comprises constraining the velocity profile to allow only forward motion along the trajectory.

29. A method according to claim 28, wherein the trajectory is a substantially half-rectangular trajectory.

30. A method of inverting spins for magnetic resonance imaging, comprising, applying an inversion pulse produced by the method of claim 12.

31. A method of inverting spins for magnetic resonance imaging, comprising, applying an inversion pulse produced by the method of claim 26.

32. Apparatus for magnetic resonance imaging configured to perform an inversion method according to claim 1.

33. Apparatus for magnetic resonance imaging configured to perform an inversion method according to claim 13.

34. An RF pulse generated according to the method of claim 12.

35. An RF pulse generated according to the method of claim 26.

* * * * *